United States Patent
Chuang et al.

(10) Patent No.: US 8,299,616 B2
(45) Date of Patent: Oct. 30, 2012

(54) T-SHAPED POST FOR SEMICONDUCTOR DEVICES

(75) Inventors: Yao-Chun Chuang, Taipei (TW);
Chen-Cheng Kuo, Chu-Pei (TW);
Ching-Wen Hsiao, Banqiao (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 230 days.

(21) Appl. No.: 12/697,008

(22) Filed: Jan. 29, 2010

(65) Prior Publication Data

US 2011/0186986 A1    Aug. 4, 2011

(51) Int. Cl.
*H01L 23/48* (2006.01)
*H01L 23/52* (2006.01)
*H01L 29/40* (2006.01)

(52) U.S. Cl. .......................... 257/758; 257/773; 438/574

(58) Field of Classification Search .................. 257/750, 257/758, 692, 697, 773, 780, 781; 438/182, 438/574, 579
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,466,635 A | 11/1995 | Lynch et al. | |
| 5,481,133 A | 1/1996 | Hsu | |
| 5,736,456 A | 4/1998 | Akram | |
| 5,759,910 A | 6/1998 | Mangold et al. | |
| 6,002,177 A | 12/1999 | Gaynes et al. | |
| 6,107,164 A | 8/2000 | Ohuchi | |
| 6,107,180 A | 8/2000 | Munroe et al. | |
| 6,175,161 B1 | 1/2001 | Goetz et al. | |
| 6,187,678 B1 | 2/2001 | Gaynes et al. | |
| 6,229,216 B1 | 5/2001 | Ma et al. | |
| 6,229,220 B1 | 5/2001 | Saitoh et al. | |
| 6,232,243 B1 | 5/2001 | Farnworth et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,323,546 B2 | 11/2001 | Hsuan et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |

(Continued)

FOREIGN PATENT DOCUMENTS

CN    1375869 A    10/2002

(Continued)

*Primary Examiner* — S. V. Clark
(74) *Attorney, Agent, or Firm* — Slater & Matsil, L.L.P.

(57) ABSTRACT

A T-shaped post for semiconductor devices is provided. The T-shaped post has an under-bump metallization (UBM) section and a pillar section extending from the UBM section. The UBM section and the pillar section may be formed of a same material or different materials. In an embodiment, a substrate, such as a die, wafer, printed circuit board, packaging substrate, or the like, having T-shaped posts is attached to a contact of another substrate, such as a die, wafer, printed circuit board, packaging substrate, or the like. The T-shaped posts may have a solder material pre-formed on the pillar section such that the pillar section is exposed or such that the pillar section is covered by the solder material. In another embodiment, the T-shaped posts may be formed on one substrate and the solder material formed on the other substrate.

20 Claims, 16 Drawing Sheets

U.S. PATENT DOCUMENTS

| | | |
|---|---|---|
| 6,454,159 B1 | 9/2002 | Takushima |
| 6,461,895 B1 | 10/2002 | Liang et al. |
| 6,562,653 B1 | 5/2003 | Ma et al. |
| 6,562,665 B1 | 5/2003 | Yu |
| 6,570,248 B1 | 5/2003 | Ahn et al. |
| 6,600,222 B1 | 7/2003 | Levardo |
| 6,600,234 B2 | 7/2003 | Kuwabara et al. |
| 6,607,938 B2 | 8/2003 | Kwon et al. |
| 6,661,085 B2 | 12/2003 | Kellar et al. |
| 6,717,245 B1 | 4/2004 | Kinsman et al. |
| 6,756,294 B1* | 6/2004 | Chen et al. .................. 438/612 |
| 6,762,076 B2 | 7/2004 | Kim et al. |
| 6,790,748 B2 | 9/2004 | Kim et al. |
| 6,887,769 B2 | 5/2005 | Kellar et al. |
| 6,906,418 B2 | 6/2005 | Hiatt et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,960,829 B2 | 11/2005 | Hogerl |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,129,575 B1 | 10/2006 | Lin et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,285,867 B2 | 10/2007 | Matsuzaki et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,327,040 B2 | 2/2008 | Aoki et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,482,703 B2* | 1/2009 | Hwang et al. .................. 257/797 |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2002/0132461 A1 | 9/2002 | Kizaki |
| 2003/0107137 A1 | 6/2003 | Stierman et al. |
| 2005/0026416 A1 | 2/2005 | Cheng et al. |
| 2005/0084989 A1 | 4/2005 | Wakabayashi et al. |
| 2006/0055032 A1 | 3/2006 | Chang et al. |
| 2006/0108685 A1 | 5/2006 | Tsou et al. |
| 2006/0113681 A1 | 6/2006 | Jeong et al. |
| 2006/0180887 A1 | 8/2006 | Ono |
| 2006/0207088 A1 | 9/2006 | Yamano |
| 2006/0211233 A1 | 9/2006 | Gan et al. |
| 2007/0029654 A1 | 2/2007 | Sunohara et al. |
| 2007/0145101 A1 | 6/2007 | Kataoka et al. |
| 2008/0093738 A1 | 4/2008 | Lin |
| 2008/0296764 A1 | 12/2008 | Chang et al. |
| 2009/0020869 A1* | 1/2009 | Xue et al. .................. 257/737 |
| 2009/0096092 A1 | 4/2009 | Patel |
| 2009/0108453 A1 | 4/2009 | Lin et al. |
| 2009/0130840 A1 | 5/2009 | Wang et al. |
| 2011/0186986 A1 | 8/2011 | Chuang et al. |
| 2011/0193220 A1 | 8/2011 | Kuo et al. |
| 2012/0012997 A1 | 1/2012 | Shen et al. |

FOREIGN PATENT DOCUMENTS

| | | |
|---|---|---|
| CN | 1750257 A | 3/2006 |
| JP | 2006-287048 | 10/2006 |

* cited by examiner

T-SHAPED POST FOR SEMICONDUCTOR DEVICES

TECHNICAL FIELD

This disclosure relates generally to semiconductor devices and, more particularly, to conductive posts for semiconductor devices.

BACKGROUND

The past few decades have seen many shifts in electronics and semiconductor packaging that have impacted the entire semiconductor industry. The introduction of surface-mount technology (SMT) and ball grid array (BGA) packages were generally important steps for high-throughput assembly of a wide variety of integrated circuit (IC) devices, while at the same time allowing for reduction of the pad pitch on the printed circuit board. Conventionally packaged ICs have a structure basically interconnected by fine gold wire between metal pads on the die and electrodes spreading out of molded resin packages. Dual Inline Package (DIP) or Quad Flat Package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP) and BGA packages are just some of the solutions that enable dense electrode arrangement without greatly increasing the package size. Some CSP techniques may provide the additional advantage of allowing for wafer packaging on a chip-size scale. CSP typically results in packages within 1.2 times the die size, which greatly reduces the potential size of devices made with the CSP material.

Some CSP or BGA packages rely on bumps of solder to provide an electrical connection between contacts on the die and contacts on a substrate, such as a packaging substrate or printed circuit board (PCB). Other CSP or BGA packages utilize a solder ball or bump placed onto a bump electrode or post, relying on the soldered joint for structural integrity. The different layers making up the interconnection typically have different coefficients of thermal expansion (CTEs). As a result, a relatively large stress derived from this difference is exhibited on the joint between the post and the bump electrode, which often causes cracks to form in the bonding area between the bump electrode/post and the solder ball or bump.

SUMMARY

A T-shaped post for semiconductor devices and a method of fabricating same is provided. The T-shaped post has an under-bump metallization (UBM) section and a pillar section extending from the UBM section. The UBM section and the pillar section may be formed of the same materials or different materials. In an embodiment, a first substrate having T-shaped posts is attached to a contact of a second substrate. The first substrate may be, for example, a die, wafer, printed circuit board, packaging substrate, or the like. The second substrate may be, for example, a die, wafer, printed circuit board, packaging substrate, or the like. The T-shaped posts may have solder material pre-formed on the pillar section such that the pillar section is exposed or such that the pillar section is covered by the solder material. In another embodiment, the T-shaped posts may be formed on one substrate and the solder material formed on the other substrate.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
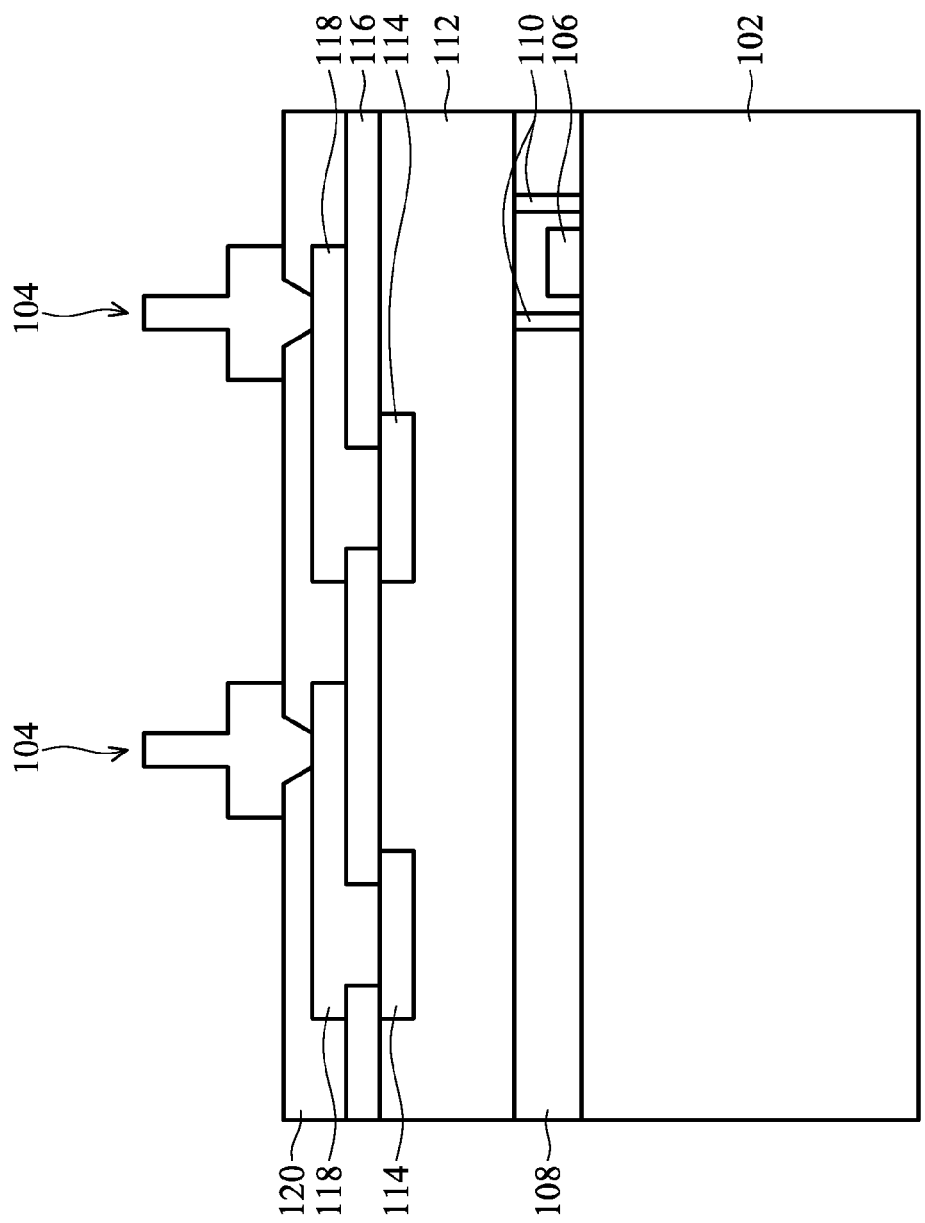
FIG. 1 illustrates a semiconductor device having a T-shaped post in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of a bump structure having a T-shaped post. As will be discussed below, embodiments are disclosed that utilize such a structure for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate, or the like. Throughout the various views and illustrative embodiments, like reference numerals are used to designate like elements.

Referring now to FIG. 1, a portion of a substrate 102 having a plurality of T-shaped posts 104 formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Electrical circuitry 106 formed on the substrate 102 may be any type of circuitry suitable for a particular application. In an embodiment, the electrical circuitry 106 includes electrical devices formed on the substrate 102 with one or more dielectric layers overlying the electrical devices. Metal layers may be formed between dielectric layers to route electrical signals between the electrical devices. Electrical devices may also be formed in one or more dielectric layers.

For example, the electrical circuitry 106 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 108. The ILD layer 108 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 108 may comprise a plurality of dielectric layers.

Contacts, such as contacts 110, are formed through the ILD layer 108 to provide an electrical contact to the electrical circuitry 106. The contacts 110 may be formed, for example, by using photolithography techniques to deposit and pattern a photoresist material on the ILD layer 108 to expose portions of the ILD layer 108 that are to become the contacts 110. An etch process, such as an anisotropic dry etch process, may be used to create openings in the ILD layer 108. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 110 as illustrated in FIG. 1.

One or more inter-metal dielectric (IMD) layers 112 and the associated metallization layers (not shown) are formed over the ILD layer 108. Generally, the one or more IMD layers 112 and the associated metallization layers are used to interconnect the electrical circuitry 106 to each other and to provide an external electrical connection. The IMD layers 112 may be formed of a low-K dielectric material, such as FSG formed by PECVD techniques or high-density plasma CVD (HDPCVD), or the like, and may include intermediate etch stop layers. Contacts 114 are provided in the uppermost IMD layer to provide external electrical connections.

It should also be noted that one or more etch stop layers (not shown) may be positioned between adjacent ones of the dielectric layers, e.g., the ILD layer 108 and the IMD layers 112. Generally, the etch stop layers provide a mechanism to stop an etching process when forming vias and/or contacts. The etch stop layers are formed of a dielectric material having a different etch selectivity from adjacent layers, e.g., the underlying semiconductor substrate 102, the overlying ILD layer 108, and the overlying IMD layers 112. In an embodiment, etch stop layers may be formed of SiN, SiCN, SiCO, CN, combinations thereof, or the like, deposited by CVD or PECVD techniques.

A protective layer 116, such as a polyimide material, may be formed and patterned over the surface of the uppermost IMD layer 112 to provide a contact to the contacts 114 and to protect the underlying layers from various environmental contaminants. Thereafter, a conductive layer 118 is formed and patterned over the protective layer 116. The conductive layer 118 provides an electrical connection upon which contact bumps may be formed for external connections. The conductive layer 118 may also act as a redistribution layer (RDL) to provide the desired pin or ball layout. The conductive layer 118 may be formed of any suitable conductive materials, such as copper, tungsten, aluminum, silver, and combinations thereof, or the like.

A passivation layer 120, such as a polyimide or other dielectric layer, is formed and patterned over the conductive layer 118, and the T-shaped posts 104 are formed over the openings of the passivation layer 120 as illustrated in FIG. 1. The T-shaped posts 104 may be formed of a suitable conductive material, such as Cu, Ni, Pt, Al, AlCu, W, CuSn, AuSn, InAu, PbSn, or the like, and are formed in electrical contact with the conductive layer 118. As explained in greater detail below, the T-shaped posts 104 may be formed by depositing a seed layer (not shown in FIG. 1) and using electroplating techniques.

As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
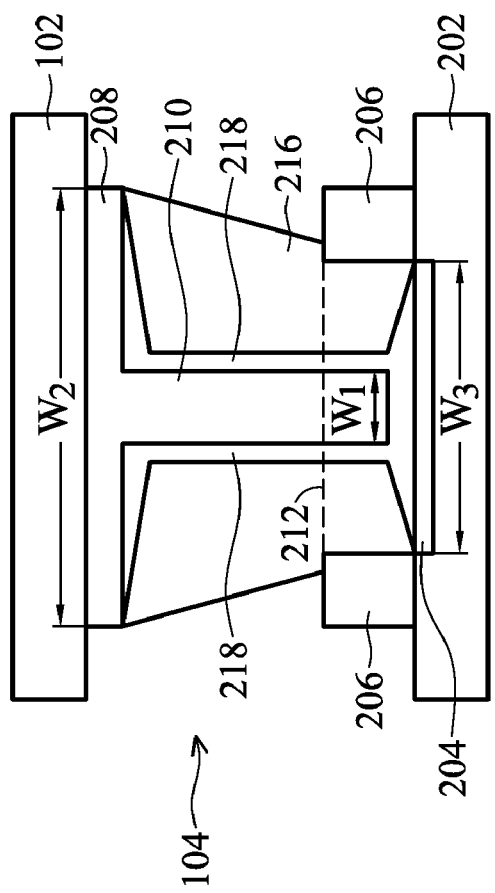
FIG. 2 illustrates two substrates coupled together using a T-shaped post in accordance with an embodiment.

Turning now to FIG. 2, the T-shaped post 104 is shown after it has been connected to second substrate 202, such as a packaging substrate, a printed-circuit board (PCB), a die, a wafer, or the like, in accordance with an embodiment, wherein like reference numerals refer to like elements. As illustrated in FIG. 2, the second substrate 202 includes a conductive contact 204. A solder mask 206, such as a polyimide layer, is formed and patterned over the second substrate 202 such that an electrical connection may be made to the conductive contact 204.

For purposes of discussion, the T-shaped post 104 comprises an under-bump metallization (UBM) section 208 and a pillar section 210. In an embodiment, the ratio between a width $W_1$ of the pillar section 210 to width $W_2$ of the UBM section 208 ($W_1/W_2$) is from about 0.2 to about 0.75. It has been found that T-shaped posts having ratios within these limits provides a proper ratio of ductile solder to high modulus materials of the T-shaped posts, e.g., Cu, upon bonding to the second substrate 202.

In an embodiment, the opening in the solder mask 206 has a width $W_3$ that allows the width $W_1$ of the pillar section 210 of the T-shaped post 104 to be inserted into the opening of the solder mask 206 such that the T-shaped post 104 extends past an upper surface (illustrated in FIG. 2 by the dotted line 212) of the solder mask 206. In this embodiment, width $W_3$ of the solder mask 206 is greater than the width $W_1$ of the T-shaped post 104 ($W_3 > W_1$).

FIG. 2 also illustrates solder material 216 and an intermetallic compound (IMC) layer 218. During the soldering process, IMCs are naturally formed in a layer, e.g., the IMC layer 218, at the joint between the solder material 216 and the adjoining surface, e.g., the T-shaped post 104 and/or the conductive contact 204. The existence of IMC layer 218 generally signifies a good weld between the solder material and the adjacent material. In an embodiment, the pillar section 210 of the T-shaped post 104 is inserted into the opening of the solder mask 206 such that the IMC layer 218 completely occupies the space between the pillar section 210 and the conductive contact 204 of the second substrate 202. In this manner, an H-shaped connection is formed by the conductive contact 204, the IMC layer 218, the pillar section 210, and the UBM section 208 and allows most of the electrical current to pass between the UBM section 208 and the conductive contact 204 through the IMC layer 218 and the pillar section 210. In an embodiment, the solder material 216 comprises SnPb, a high-Pb material, a Sn-based solder, a lead-free solder, or other suitable conductive material.

Figure 3A:
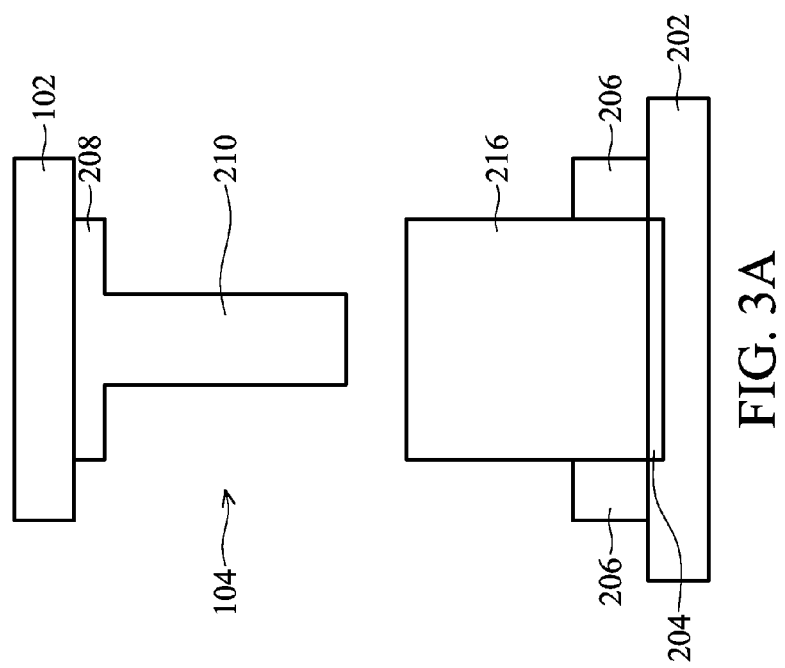
FIGS. 3a-3c illustrate various embodiments of providing a T-shaped post and solder material.
Figure 3C:
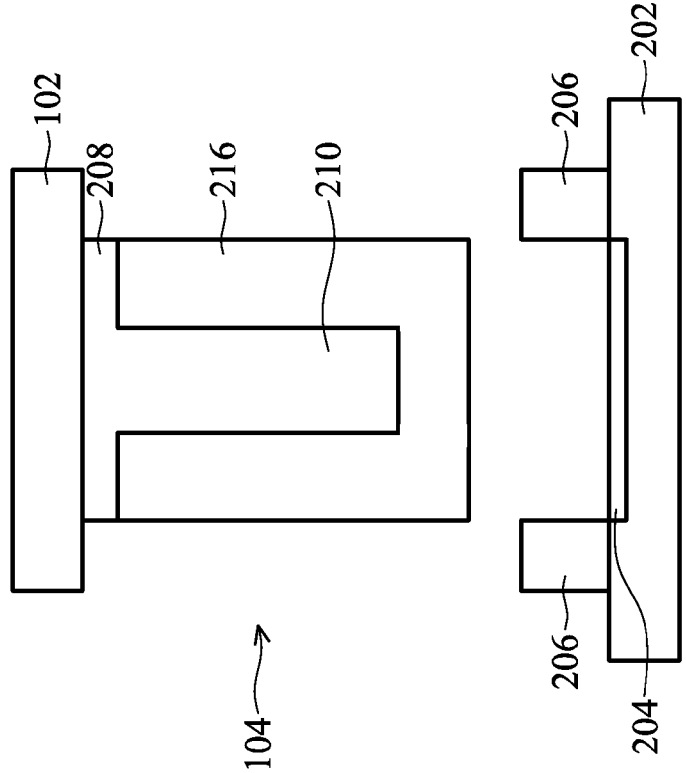
Figure 3B:
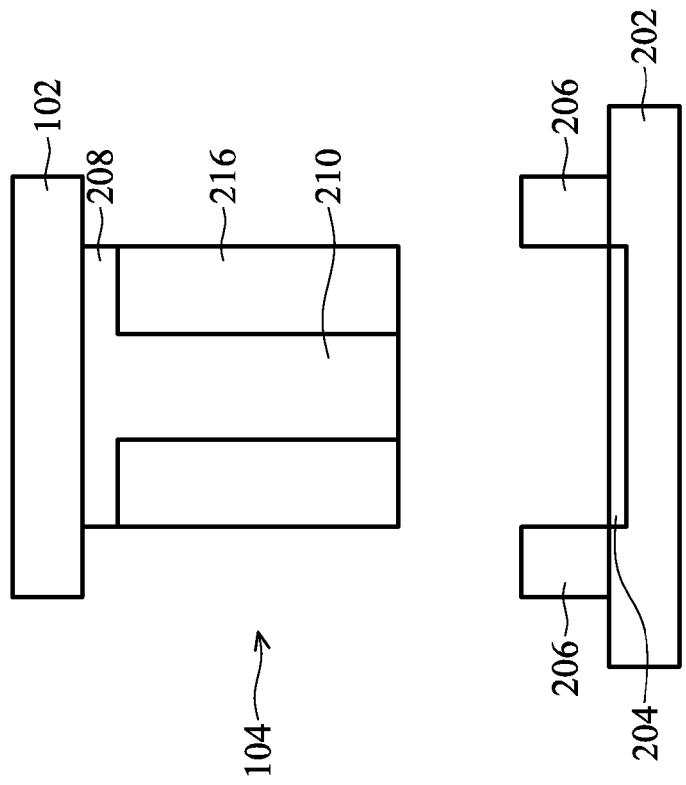

FIGS. 3a-3c illustrate three different configurations of the T-shaped post 104 that may be used in various wafer configurations and procedures in preparation to attach the first substrate 102 to the second substrate 202, which may be a die, wafer, circuit board, packaging substrate, or the like. Referring first to FIG. 3a, the T-shaped post 104 is shown without solder material being directly attached thereto. Rather, in this embodiment, a second substrate 202 is provided with solder material 216 on to which the T-shaped post 104 is to be attached.

In FIG. 3b, the solder material is placed directly on the T-shaped post 104 on the first substrate 102. In this embodiment, the solder material 216 is not required on the second substrate 202 because the solder material 216 is provided on the T-shaped post 104, which in this embodiment is exposed through the solder material 216.

In FIG. 3c, an embodiment similar to the embodiment of FIG. 3b is shown. In this embodiment, however, the T-shaped post 104 is covered by the solder material 216.

Figure 4:
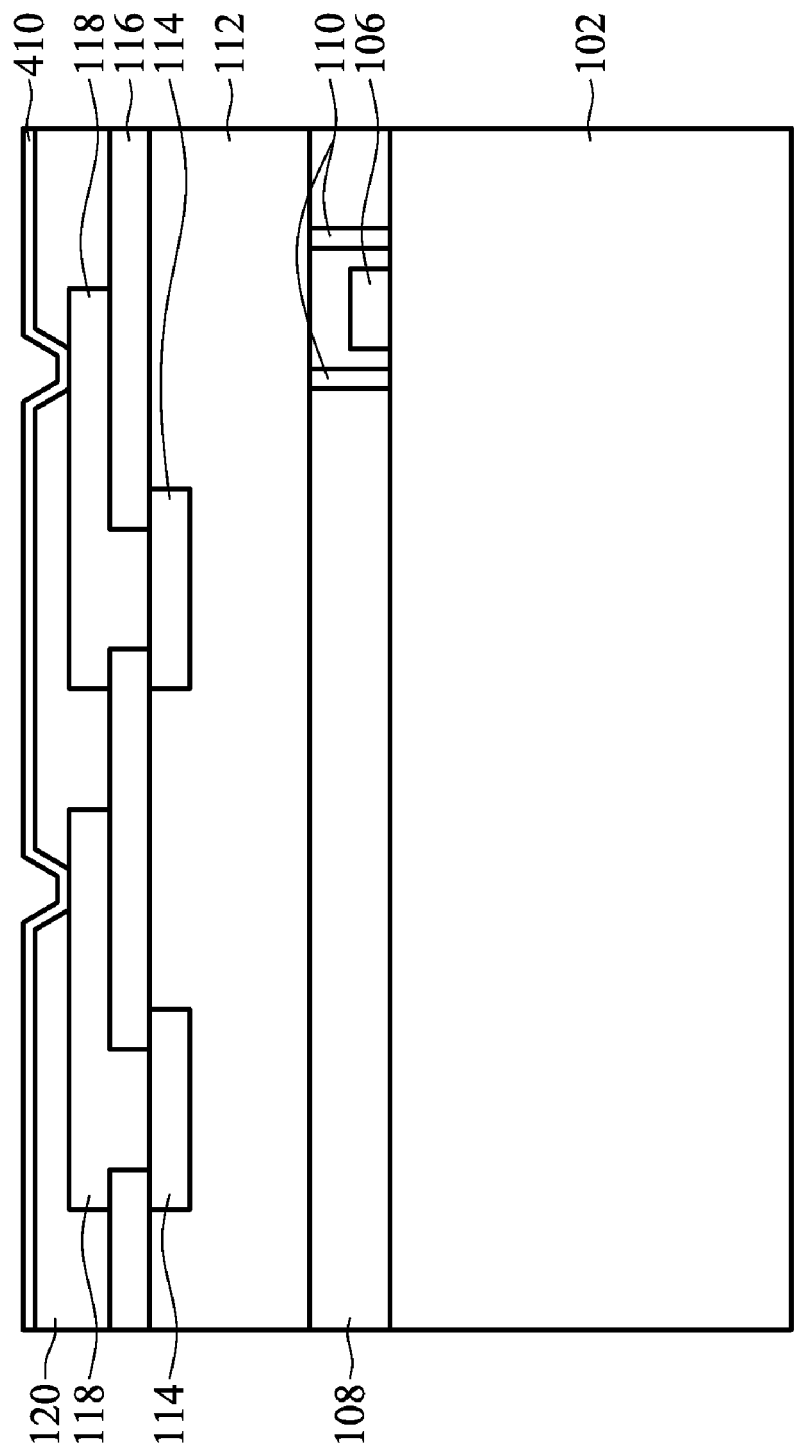
FIGS. 4-9 illustrate a method of forming a T-shaped post in accordance with an embodiment.

FIGS. 4-9 illustrate various intermediate stages of a method of forming T-shaped post of the type discussed above with reference to FIG. 3a. Referring first to FIG. 4, a substrate 102 is prepared with the various layers, structures, devices, and the like, as discussed above with reference to FIG. 1, wherein like reference numerals refer to like elements. Any suitable process may be used to form the structures and will not be discussed in greater detail herein. Accordingly, the substrate 102 is prepared having a passivation layer 120 formed and patterned to expose portions of the underlying conductive layer 118.

Thereafter, as illustrated in FIG. 4, a conformal seed layer 410 is deposited over the surface of the passivation layer 120. The seed layer 410 is a thin layer of a conductive material that aids in the formation of a thicker layer during subsequent processing steps. In an embodiment, the seed layer 410 may be formed by depositing a thin conductive layer, such as a thin layer of Cu, Ti, Ta, TiN, TaN, combinations thereof, or the like, using CVD or physical vapor deposition (PVD) techniques. For example, a layer of Ti is deposited by a PVD process to form a barrier film and a layer of Cu is deposited by a PVD process to form a seed layer.

Figure 5:
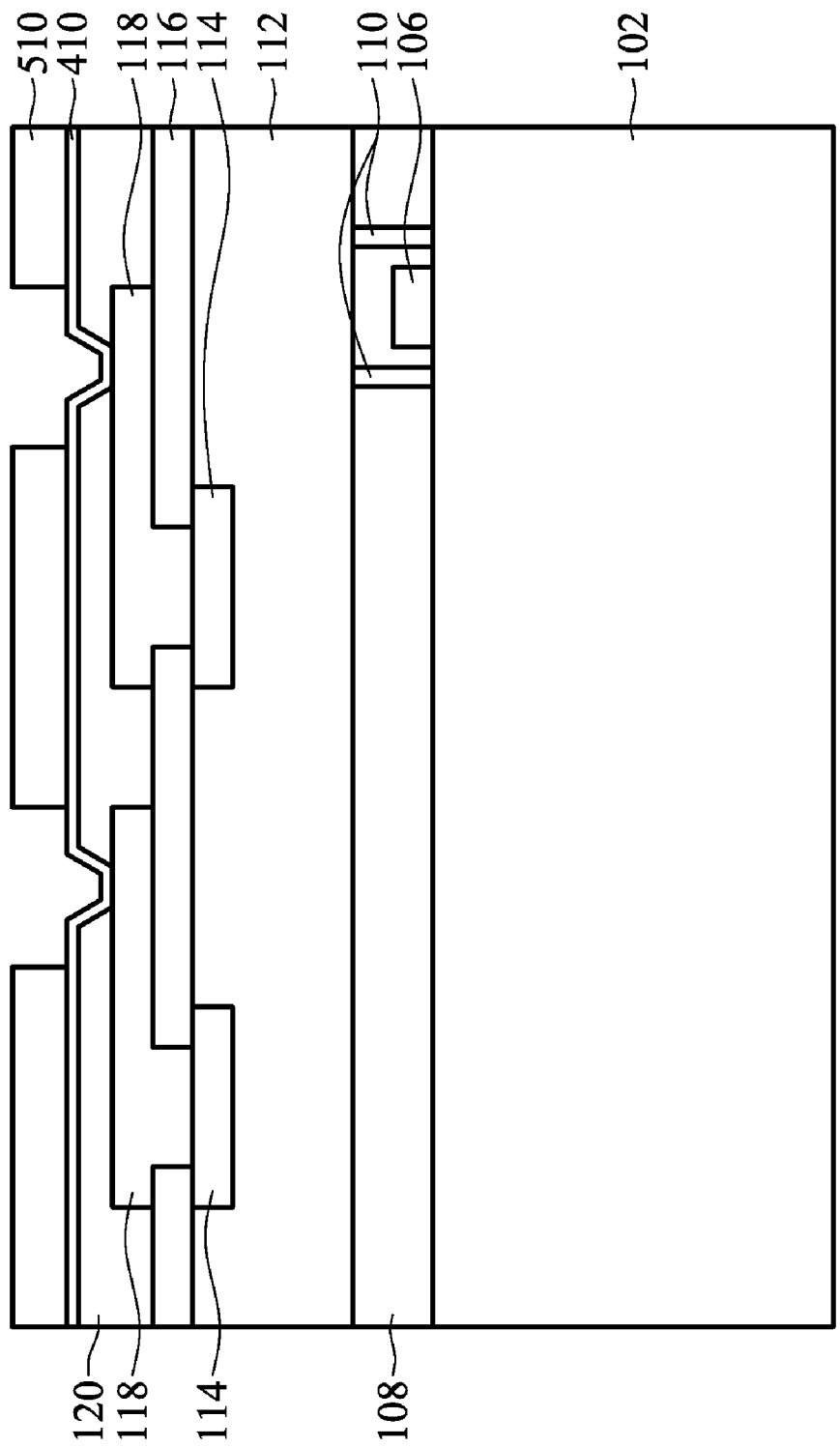

Thereafter, as illustrated in FIG. 5, a first patterned mask 510 is formed over the seed layer 410 in accordance with an embodiment. The first patterned mask 510 defines the shape of the UBM section 208 of the T-shaped post 104 (see FIG. 2) as discussed in greater detail below. The first patterned mask 510 may be a patterned photoresist mask, hard mask, a combination thereof, or the like.

Figure 6:
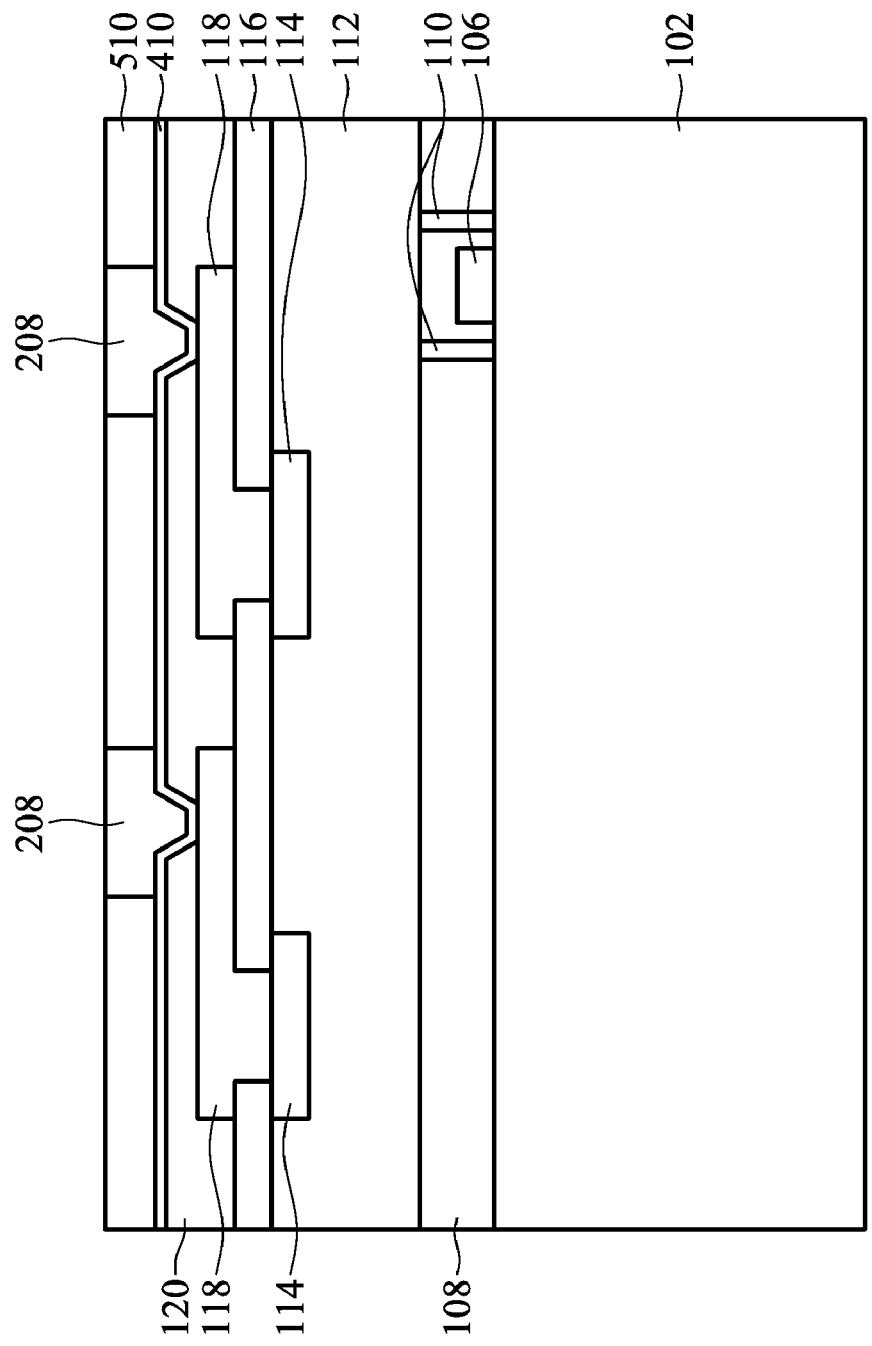

FIG. 6 illustrates the formation of the UBM section 208 of the T-shaped post 104 in accordance with an embodiment. The UBM section 208 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like. It should be noted that some embodiments, such as those that deposit a conformal layer over the entire surface of the wafer (e.g., PVD and CVD), may be desirable to perform an etching or planarization process (e.g., a chemical mechanical polishing (CMP)) to remove excess conductive material from the surface of the first patterned mask 510. In an embodiment, the UBM section 208 has a thickness between about 2 µm and about 20 µm.

Figure 7:
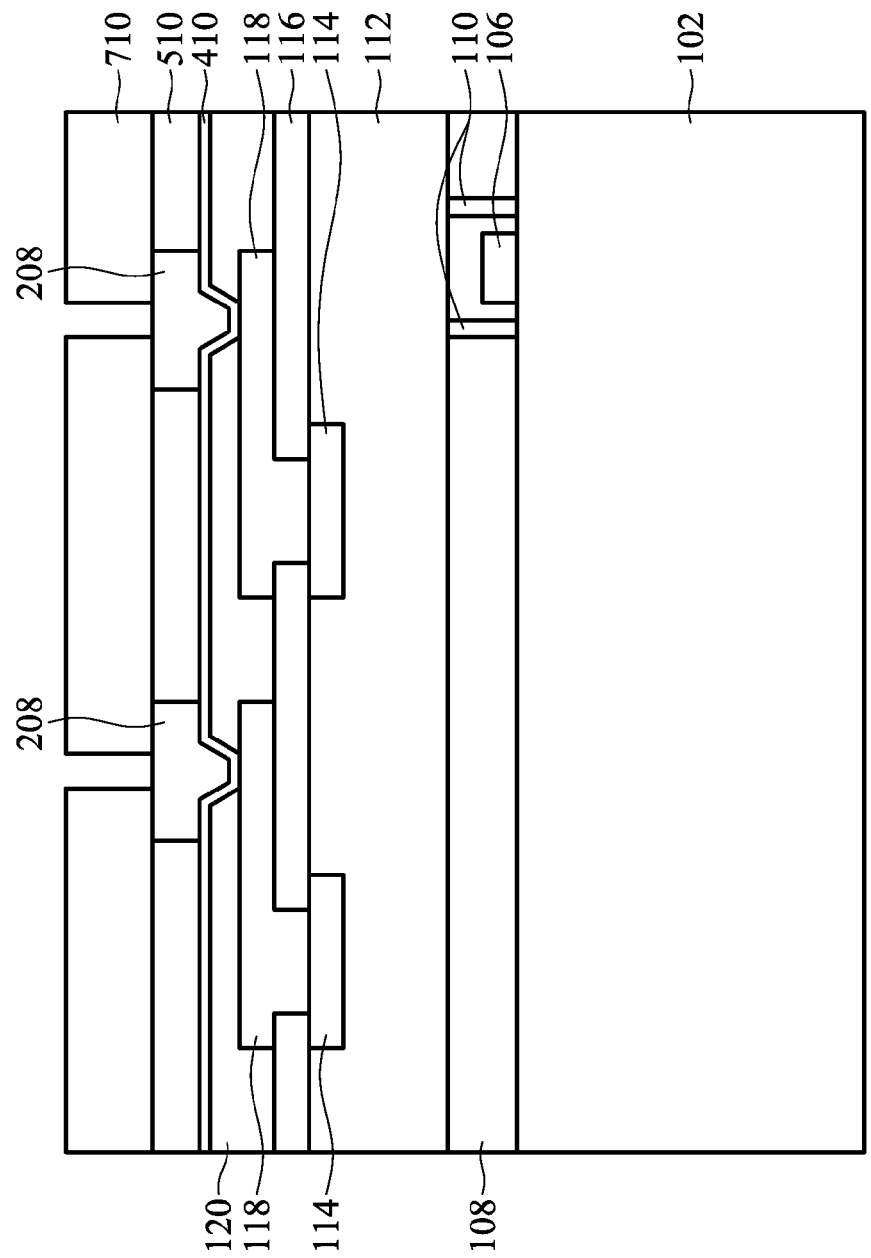

FIG. 7 illustrates formation of a second patterned mask 710 over the first patterned mask 510 in accordance with an embodiment. The second patterned mask 710 defines the shape of the pillar section 210 of the T-shaped post 104 (see FIG. 2) as discussed in greater detail below. The second patterned mask 710 may be a patterned photoresist mask, hard mask, a combination thereof, or the like.

Figure 8:
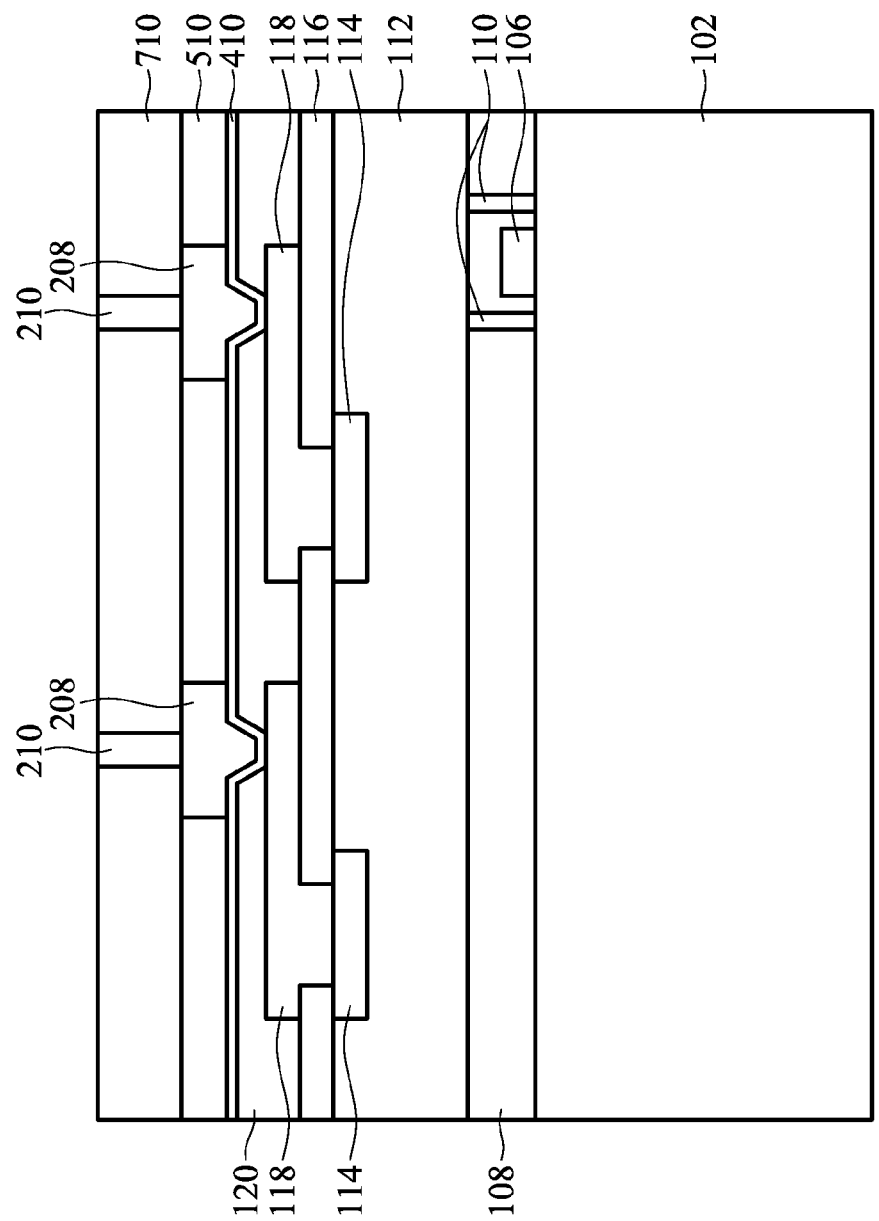

Thereafter, FIG. 8 illustrates the formation of the pillar section 210 of the T-shaped post 104 in accordance with an embodiment. The pillar section 210 may be formed of any suitable conductive material, including Cu, Ni, Pt, Al, combinations thereof, or the like, and may be formed through any number of suitable techniques, including PVD, CVD, ECD, MBE, ALD, electroplating, and the like. In some embodiments, the pillar section 210 and the UBM section 208 are formed of the same material, while in other embodiments, the pillar section 210 and the UBM section 208 may be formed of different materials. It should be noted that some embodiments, such as those that deposit a conformal layer over the entire surface of the wafer (e.g., PVD and CVD), may be desirable to perform an etching or planarization process to remove excess conductive material from the surface of the second patterned mask 710. In an embodiment, the pillar section 210 has a thickness between about 20 µm and about 100 µm.

Figure 9:
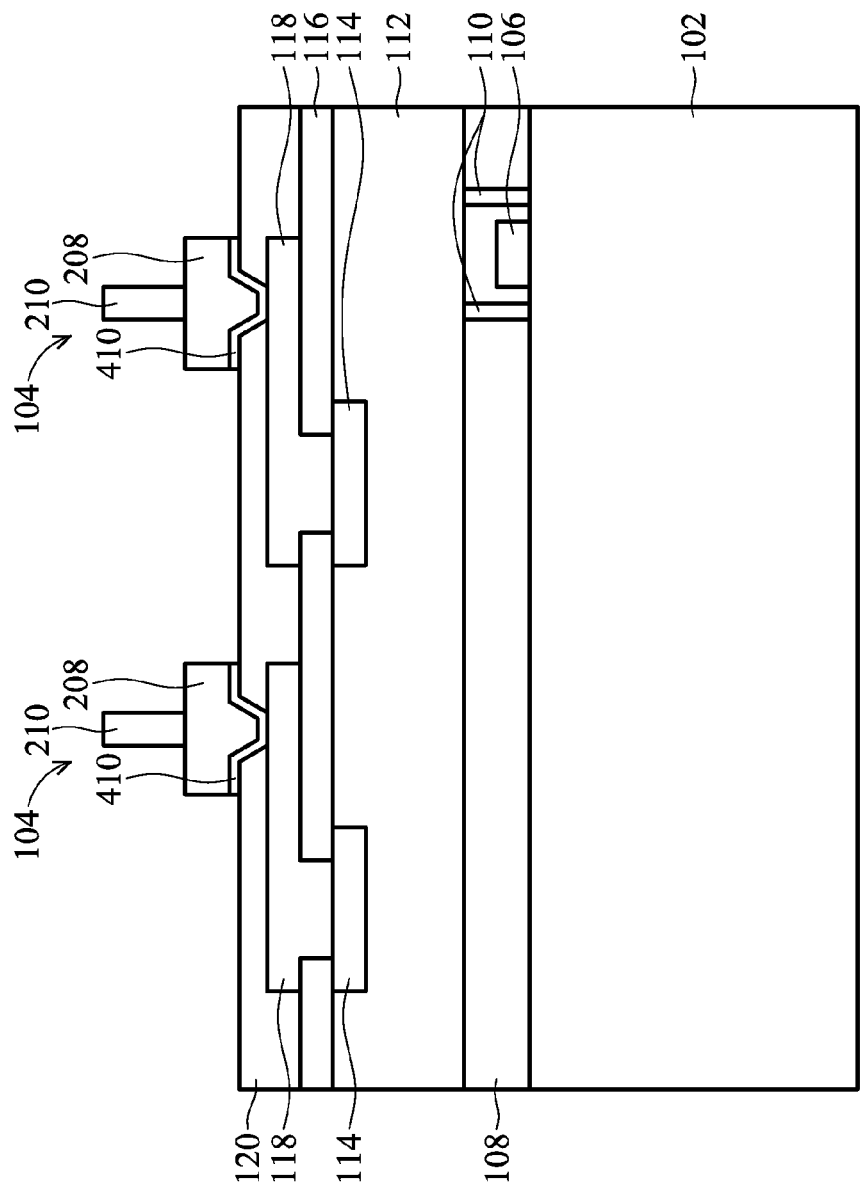

After the T-shaped post 104 is formed, the first patterned mask 510 and the second patterned mask 710 may be removed as illustrated in FIG. 9. In embodiments in which the first patterned mask 510 and the second patterned mask 710 are formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9) or another stripping process. A cleaning process, such as a wet dip in a chemical solution of phosphoric acid ($H_3PO_4$) and hydrogen peroxide ($H_2O_2$), referred to as DPP, with 1% hydrofluoric (HF) acid, or another cleaning process, may be performed to remove exposed portions of the seed layer 410 and any contaminants from the surface of the passivation layer 120.

Thereafter, other back-end-of-line (BEOL) processing techniques suitable for the particular application may be performed. For example, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 10:
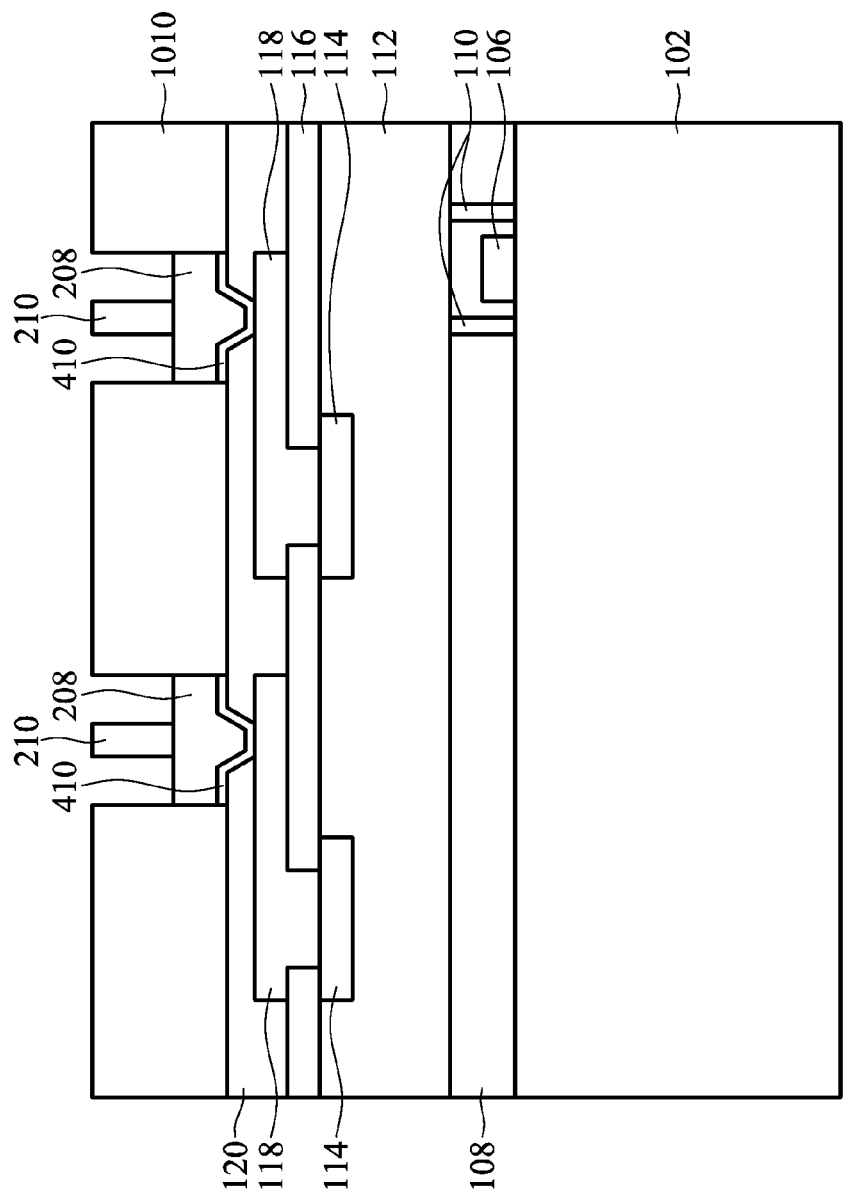
FIGS. 10-12 illustrate a method of forming a T-shaped post in accordance with another embodiment.
Figure 11:
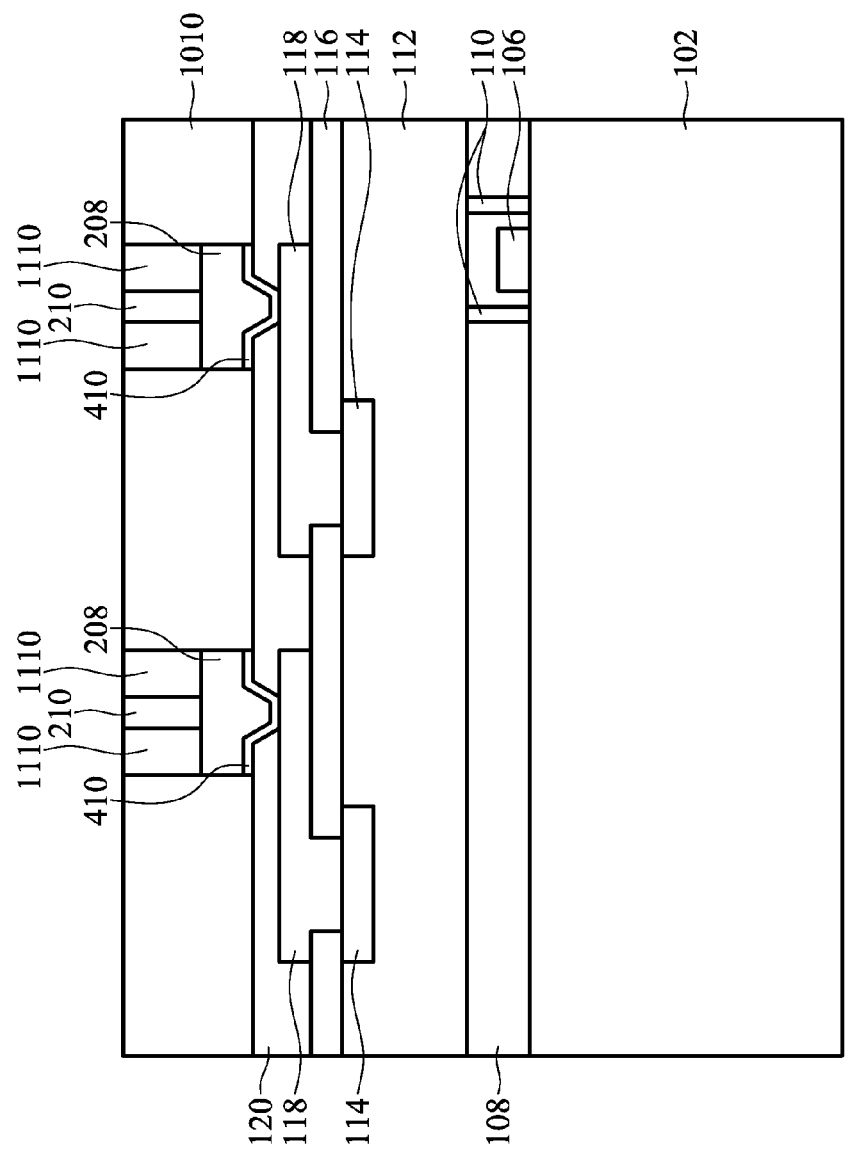
Figure 12:
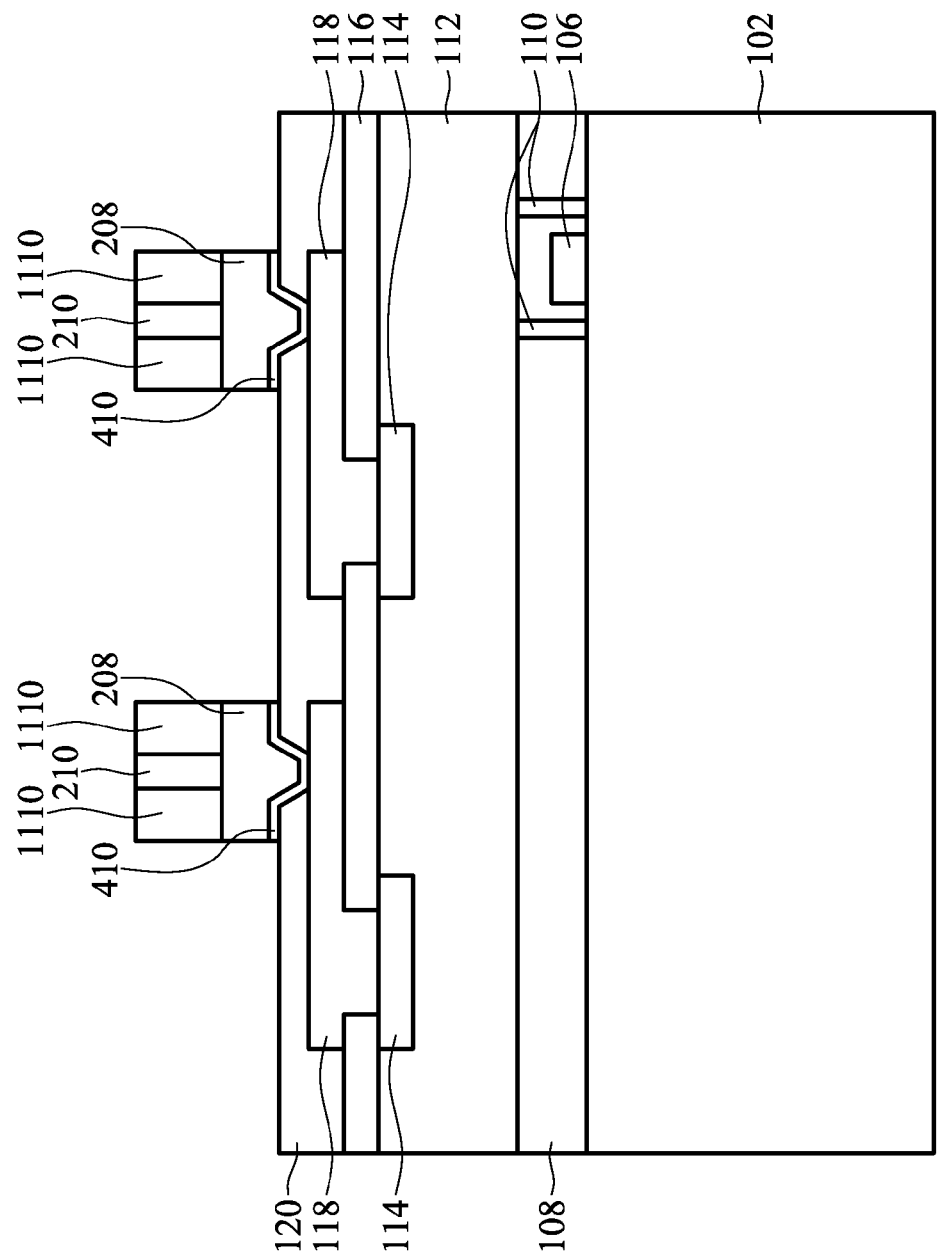

FIGS. 10-12 illustrate the intermediate stages of a method of forming a T-shaped post of the type discussed above with reference to FIG. 3b. The embodiment illustrated in FIGS. 10-12 assume a process similar to that discussed above with reference to FIGS. 4-9. Accordingly, FIG. 10 illustrates an intermediate stage after completing the process discussed above with reference to FIG. 9.

Referring now to FIG. 10, formation of a third patterned mask 1010 in accordance with an embodiment is illustrated. The third patterned mask 1010 defines the shape of solder material to be placed around the pillar section 210 of the T-shaped post 104 as discussed in greater detail below. The third patterned mask 1010 may be a patterned photoresist mask, hard mask, a combination thereof, or the like.

Thereafter, in FIG. 11, solder material 1110 may be formed. In an embodiment, the solder material 1110 is formed of SnPb, a high-Pb material, a Sn-based solder, a lead-free solder, or another suitable conductive material, by electroplating techniques. A planarizing process, such as a CMP, may be used to remove the solder material 1110 from an end of the pillar section 210, thereby exposing the end of the pillar section 210 as illustrated in the embodiment of FIG. 11.

After the solder material 1110 is formed, the third patterned mask 1010 may be removed as illustrated in FIG. 12. In embodiments in which the third patterned mask 1010 is formed from photoresist materials, the photoresist may be stripped by, for example, a chemical solution such as SPR920 or another stripping process. A cleaning process, such as a wet dip in a chemical solution of DPP and 1% hydrofluoric (HF) acid or another cleaning process, may be performed to remove exposed portions of the seed layer 410 and any contaminants from the surface of the passivation layer 120.

Thereafter, other BEOL processing techniques suitable for the particular application may be performed. For example, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 13:
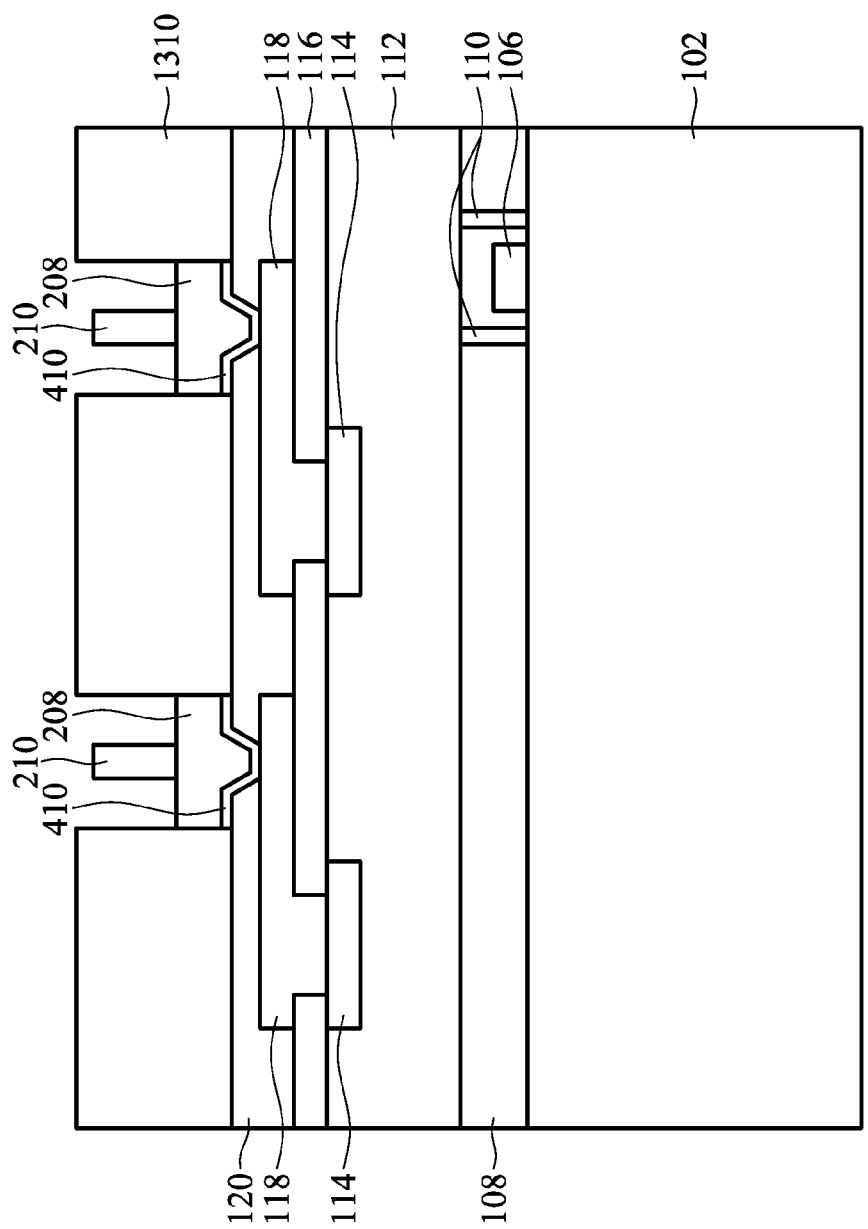
FIGS. 13-15 illustrate a method of forming a T-shaped post in accordance with yet another embodiment.
Figure 14:
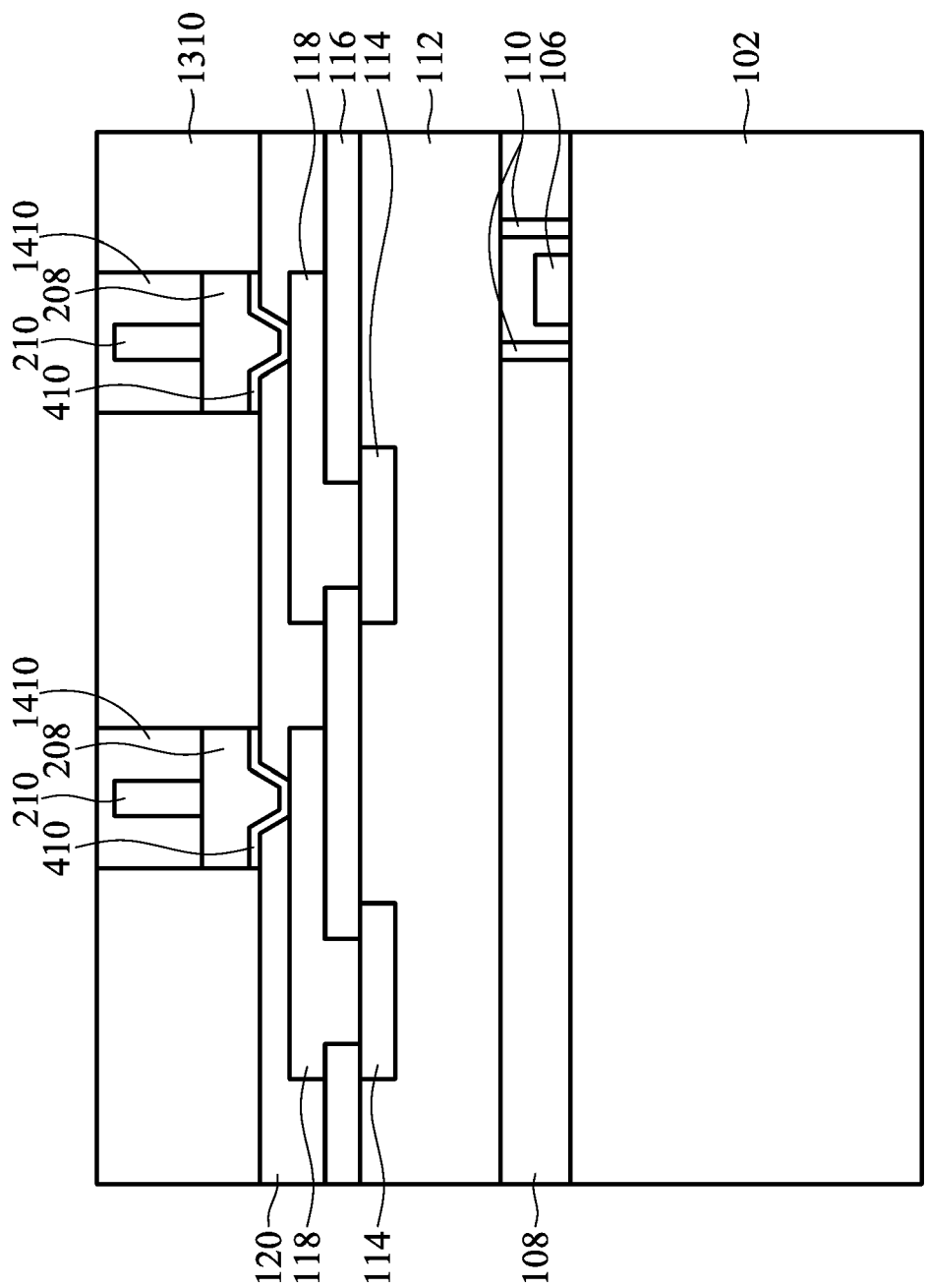
Figure 15:
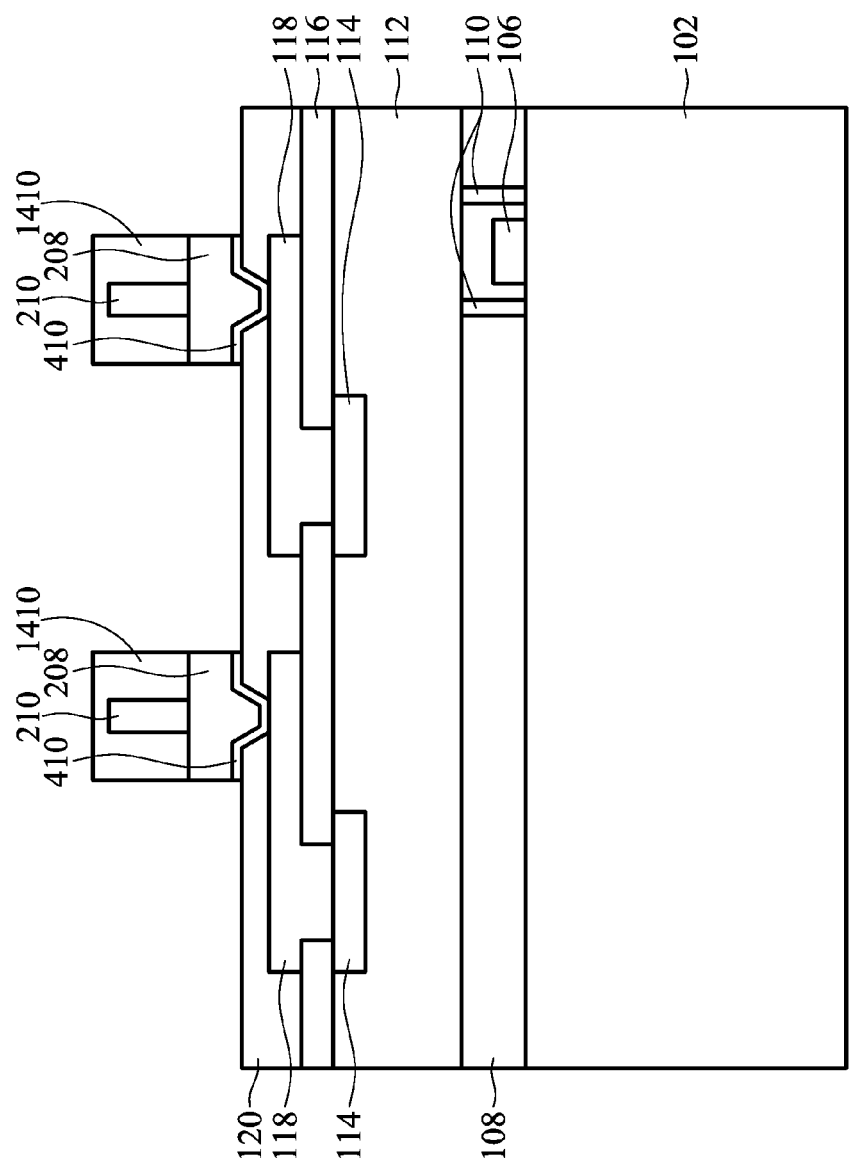

FIGS. 13-15 illustrate the intermediate stages of a method of forming T-shaped posts of the type discussed above with reference to FIG. 3c. The embodiment illustrated in FIGS. 13-15 assume a process similar to that discussed above with reference to FIGS. 4-9. Accordingly, FIG. 13 illustrates an intermediate stage after completing the process discussed above with reference to FIG. 9.

Referring now to FIG. 13, formation of a third patterned mask 1310 in accordance with an embodiment is illustrated. The third patterned mask 1310 defines the shape of solder material to be placed around the pillar section 210 of the T-shaped post 104 as discussed in greater detail below. The third patterned mask 1310 may be a patterned photoresist mask, hard mask, a combination thereof, or the like. In an embodiment, a photoresist material is deposited to a thickness of about 50 to about 100 um and patterned using photolithographic techniques.

Thereafter, in FIG. 14, solder material 1410 may be formed. In an embodiment, the solder material 1410 is formed of SnPb, a high-Pb material, a Sn-based solder, a lead-free solder, or another suitable conductive material by electroplating techniques.

After the solder material 1410 is formed, the third patterned mask 1310 may be removed as illustrated in FIG. 15. In embodiments in which the third patterned mask 1310 is formed from photoresist materials, the photoresist may be stripped by, for example, a chemical solution such as SPR920 or another stripping process. A cleaning process, such as a wet dip in a chemical solution of DPP and 1% hydrofluoric (HF) acid, may be performed to remove exposed portions of the seed layer 410 and any contaminants from the surface of the passivation layer 120.

Thereafter, other BEOL processing techniques suitable for the particular application may be performed. For example, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

One of ordinary skill in the art will realize that similar processes may be used to form the embodiments illustrated in FIGS. 3b and 3c. For example, one will note that the process illustrated in FIGS. 10-12 is similar to the process illustrated in FIGS. 13-15 with the exception that the thickness of the third patterned mask 1010 in FIG. 10 is approximately the same as the height of the pillar section 210 of the T-shaped post 104 whereas the thickness of the third patterned mask 1310 in FIG. 13 is greater than the height of the pillar section 210 of the T-shaped post 104. This difference in thicknesses accounts for the different thicknesses in the solder material over the pillar section 210.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
a first substrate comprising a first conductive layer;
a T-shaped post electrically coupled to the first conductive layer, the T-shaped post having an under-bump metallization (UBM) section in contact with the first conductive layer and a pillar section extending from the UBM section, the UBM section having a first width and the pillar section having a second width, the first width being greater than the second width;
a second substrate having a second conductive layer;
a solder material around the pillar section and in electrical contact with the first conductive layer and the second conductive layer; and
an inter-metallic compound (IMC) layer interposed between the pillar section and the second conductive layer, the IMC layer extending continuously between the second conductive layer and the pillar section.

2. The semiconductor structure of claim 1, wherein the pillar section is formed of a different material than the UBM section.

3. The semiconductor structure of claim 1, wherein the first substrate is a first wafer and the second substrate is a second wafer.

4. The semiconductor structure of claim 1, wherein at least one of the first substrate and the second substrate is a die.

5. The semiconductor structure of claim 1, wherein a width of the pillar section is between 0.2 and 0.75 times a width of the UBM section.

6. The semiconductor structure of claim 1, wherein the second substrate comprises a solder mask, the pillar section extending past an upper surface of the solder mask.

7. A semiconductor structure comprising:
a first substrate comprising a first conductive layer and a passivation layer over at least a portion of the first conductive layer; and
a T-shaped post on the first conductive layer, the T-shaped post having an under-bump metallization (UBM) section and a pillar section, the UBM section being interposed between the pillar section and the first substrate, the UBM section having a wider width than the pillar section in a direction parallel to a major surface of the first substrate, the T-shaped post being a single layer of continuous material.

8. The semiconductor structure of claim 7, further comprising a solder material in contact with the T-shaped post, wherein the solder material does not cover an end of the pillar section of the T-shaped post.

9. The semiconductor structure of claim 7, further comprising a solder material in contact with the T-shaped post, the solder material covering an end of the pillar section of the T-shaped post.

10. The semiconductor structure of claim 7, wherein a width of the pillar section is between 0.2 and 0.75 times a width of the UBM section.

11. The semiconductor structure of claim 7, wherein the UBM section is formed of a different material than the pillar section.

12. A method of forming a semiconductor device, the method comprising:
providing a first substrate having a contact;
forming a passivation layer over the first substrate, at least a portion of the contact being exposed;
forming a first patterned mask over the passivation layer, the first patterned mask having a first opening exposing at least a portion of the contact;
forming an under-bump metallization (UBM) section in the first opening;
forming a second patterned mask over the first patterned mask, the second patterned mask having a second opening exposing only a portion of the UBM section;
forming a pillar section in the second opening, the UBM section and the pillar section forming a T-shaped contact; and
removing the first patterned mask and the second patterned mask.

13. The method of claim 12, wherein a width of the pillar section is between 0.2 and 0.75 times a width of the UBM section.

14. The method of claim 12, further comprising:
forming a third patterned mask over the passivation layer, the third patterned mask having an upper surface level with a top of the pillar section, the third patterned mask exposing the pillar section;
forming a solder material around the pillar section such that the top of the pillar section is exposed; and
removing the third patterned mask.

15. The method of claim 12, further comprising:
forming a third patterned mask over the passivation layer, the third patterned mask having an upper surface higher than a top of the pillar section, the third patterned mask exposing the pillar section;
forming a solder material around the pillar section such that the top of the pillar section is covered by the solder material; and
removing the third patterned mask.

16. The method of claim 12, wherein the first substrate is a first wafer, and further comprising attaching a second wafer.

17. The method of claim 12, further comprising:
providing a second substrate having a conductive contact and a solder mask; and
attaching the first substrate to the second substrate such that the pillar section is inserted into an opening in the solder mask.

18. The method of claim 17, wherein an inter-metallic compound (IMC) layer is interposed between the pillar section and the conductive contact, the IMC layer extending continuously from the conductive contact and the pillar section.

19. The method of claim 12, further comprising:
providing a second substrate having conductive contact, a solder mask, and a solder material within an opening of the solder mask; and
attaching the first substrate to the second substrate such that the pillar section is inserted into the solder material in the opening of the solder mask.

20. A semiconductor structure comprising:
a first substrate comprising a first conductive layer and a passivation layer over at least a portion of the first conductive layer; and
a T-shaped post on the first conductive layer, the T-shaped post having an under-bump metallization (UBM) section and a pillar section, the UBM section being above the passivation layer, wherein a width of the pillar section is between 0.2 and 0.75 times a width of the UBM section.

* * * * *